United States Patent [19]
Sato et al.

[11] Patent Number: 5,817,444
[45] Date of Patent: Oct. 6, 1998

[54] POSITIVE-WORKING PHOTORESIST COMPOSITION AND MULTILAYERED RESIST MATERIAL USING THE SAME

[75] Inventors: Kazufumi Sato, Sagamihara; Kazuyuki Nitta, Ebina; Akiyoshi Yamazaki, Yokohama; Yoshika Sakai, Atsugi; Toshimasa Nakayama, Chigasaki, all of Japan

[73] Assignee: Tokyo Ohka Kogyo Co., Ltd., Japan

[21] Appl. No.: 927,658

[22] Filed: Sep. 11, 1997

[30] Foreign Application Priority Data

Sep. 20, 1996 [JP] Japan ................................. 8-250712

[51] Int. Cl.$^6$ ............................................. G03F 7/004
[52] U.S. Cl. .................. 430/155; 430/170; 430/270.1; 430/271.1; 430/512
[58] Field of Search ........................ 430/155, 170, 430/270.1, 271.1, 512

[56] References Cited

U.S. PATENT DOCUMENTS

| | | |
|---|---|---|
| 5,069,997 | 12/1991 | Schwalm et al. . |
| 5,558,971 | 9/1996 | Urano et al. ........................ 430/270.1 |
| 5,585,218 | 12/1996 | Nakano et al. ...................... 430/270.1 |
| 5,736,296 | 4/1998 | Sato et al. .......................... 430/270.1 |
| 5,750,309 | 5/1998 | Hatakeyama et al. ............... 430/270.1 |

FOREIGN PATENT DOCUMENTS

| | | |
|---|---|---|
| 0679951 | 11/1995 | European Pat. Off. . |
| 2-25850 | 1/1990 | Japan . |
| 2-248952 | 10/1990 | Japan . |
| 3-282550 | 12/1991 | Japan . |
| 8-87115 | 4/1996 | Japan . |

*Primary Examiner*—John S. Chu
*Attorney, Agent, or Firm*—Wenderoth, Lind & Ponack, L.L.P.

[57] ABSTRACT

Proposed is a novel chemical-sensitization positive-working photoresist composition suitable for fine patterning of a resist layer in the manufacture of electronic devices. The composition is advantageous in various properties of photoresist composition without little dependency on the nature of the substrate surface, on which the photoresist layer is formed, with or without an antireflection undercoating layer. The most characteristic ingredient in the inventive composition is the film-forming resinous ingredient which is a combination of a first polyhydroxystyrene resin substituted by tetrahydropyranyl groups for the hydroxyl groups and a second hydroxystyrene resin substituted by alkoxyalkyl groups for the hydroxyl groups in a specified weight proportion of the first and second resins.

21 Claims, No Drawings

POSITIVE-WORKING PHOTORESIST COMPOSITION AND MULTILAYERED RESIST MATERIAL USING THE SAME

BACKGROUND OF THE INVENTION

The present invention relates to a novel positive-working photoresist composition and a multilayered resist material by using the same. More particularly, the invention relates to a chemical-sensitization positive-working photoresist composition which is excellent in the photosensitivity, focusing depth characteristic and after-exposure stability of the latent images and capable of giving a patterned resist layer having an excellently orthogonal cross sectional profile with little dependency on the nature of the substrate surface on which the resist layer is formed as well as to a multilayered resist material for patterning having a layer of the inventive photoresist composition on an antireflection undercoating layer.

It is a remarkable trend in the manufacturing process of semiconductor devices, liquid crystal display panels and the like in recent years that the photolithographic fine patterning work is conducted more and more frequently by using a chemical-sensitization photoresist composition in place of photoresist compositions of other conventional types. A chemical-sensitization photoresist composition contains a radiation-sensitive acid-generating agent capable of releasing an acid by exposure to actinic rays and, when the photoresist layer on a substrate surface is exposed pattern-wise to actinic rays such as ultraviolet light, the acid generated from the acid-generating agent in the resist composition in the areas exposed pattern-wise catalytically acts on the film-forming resinous ingredient of the resist layer to change the solubility behavior of the resin in an aqueous alkaline developer solution. By virtue of the catalytic activity of the acid, the photoresist composition of this type is advantageous in the high photosensitivity and pattern resolution even with a relatively small amount of the acid-generating agent.

Chemical-sensitization photoresist compositions are classified into positive-working and negative-working photoresist compositions depending on the types of the resinous ingredient which causes a change in the behavior of alkali-solubility by the catalytic activity of the acid released from the acid-generating agent. Japanese Patent Kokai 8-15864 proposes various chemical-sensitization photoresist compositions containing, as the film-forming resinous ingredient, a first polyhydroxystyrene resin substituted by tert-butoxycarbonyl groups for a part of the hydroxyl hydrogen atoms and a second polyhydroxystyrene resin substituted by lower alkoxyalkyl groups for a part of the hydroxyl hydrogen atoms in combination. These photoresist compositions, though advantageous in respect of the high photosensitivity and pattern resolution as well as the cross sectional profile of patterned resist layer, are not always quite satisfactory in order to comply with the rapidly upgrading requirements in recent years for the performance of a photoresist composition relative to the contrast of the pattern images, resolution around and configuration of contact holes formed by patterning and heat resistance of the resist layer.

On the other hand, it is a widely practiced promising process to provide an antireflection undercoating layer between the substrate surface and the photoresist layer thereon in respect of the possibility of obtaining higher pattern resolution than otherwise so that it is eagerly desired to develop a chemical-sensitization positive-working photoresist composition particularly suitable for use on an antireflection undercoating layer. A problem encountered in the use of such a photoresist composition on an antireflection undercoating layer is that deterioration sometimes takes place not only in the cross sectional profile of the patterned resist layer but also in the focusing depth characteristic.

Besides, there are several other problems to be solved including the stability of the latent image in the resist layer before the post-exposure baking treatment presumably due to contamination with a basic substance to cause deactivation of the acid generated by the pattern-wise exposure to light resulting in an overhanging cross sectional profile of the patterned resist layer and the so-called substrate dependency of the cross sectional profile of the patterned resist layer typically exemplified by the trailing skirts of the cross sectional profile when the substrate surface is provided with an insulating layer of silicon nitride or borophosphosilicate glass or with a titanium nitride film or metallic layer of an aluminum-silicon-copper-tungsten alloy.

SUMMARY OF THE INVENTION

The present invention accordingly has an object, in view of the above described problems and disadvantages in the prior art, to provide a novel chemical-sensitization positive-working photoresist composition which is, irrespective of intervention or omission of an antireflection undercoating layer, excellent in the photosensitivity, pattern resolution, focusing depth characteristic and post-exposure stability and cross sectional profile of the patterned resist layer and also in the contrast of the patterned images, resolution around and configuration of the contact holes and heat resistance with little dependency on the nature of the substrate surface.

Thus, the chemical-sensitization positive-working photoresist composition provided by the present invention, which is a uniform solution in an organic solvent, comprises:
(A) 100 parts by weight of a film-forming resin which causes an increase in the solubility in an aqueous alkaline solution by interacting with an acid, which is a combination of
  (A1) a first polyhydroxystyrene resin substituted by tetrahydropyranyl groups for a part of the hydroxyl hydrogen atoms, and
  (A2) a second polyhydroxystyrene resin substituted by lower alkoxyalkyl groups for a part of the hydroxyl hydrogen atoms
in a weight proportion of 10:90 to 80:20; and
(B) from 0.5 to 20 parts by weight of a radiation-sensitive acid-generating compound capable of generating an acid by exposure to actinic rays.

Besides the above described essential ingredients (A) and (B), the inventive photoresist composition optionally contains:
(C) from 0.01 to 1 part by weight of an amine compound; and/or
(D) from 0.01 to 10 parts by weight of a carboxylic acid compound.

The invention also provides a multilayered photoresist material for photolithographic patterning which comprises, as an integral body: (a) a substrate; (b) an antireflection undercoating layer formed on one surface of the substrate; and (c) a photoresist layer formed on the antireflection undercoating layer from the chemical-sensitization positive-working photoresist composition defined above.

DETAILED DESCRIPTION OF THE PREFERRED EMBODIMENTS

As is understood from the above given description, the most characteristic feature of the inventive photoresist composition consists in the use of the film-forming resin which is a combination of two specific polyhydroxystyrene resins as the components (A1) and (A2).

The component (A1) is a first polyhydroxystyrene resin substituted for a part of the hydroxyl hydrogen atoms by tetrahydropyranyl groups, which per se is known as disclosed in Japanese Patent Kokai 2-19847, 2-25850, 2-248952 and 3-282550 and elsewhere. It is the prior art that such a polyhydroxystyrene resin is used in the photoresist compositions either singly or as a combination with a novolak resin while the cross sectional profile of the patterned resist layer obtained from such a photoresist composition cannot be orthogonal but sometimes has rounded shoulders or trailing skirts.

The degree of substitution by the tetrahydropyranyl groups in the component (A1) is in the range from 10 to 60% or, preferably, from 20 to 50% of the hydroxyl hydrogen atoms in the polyhydroxystyrene resin in order to accomplish a good cross sectional profile of the patterned resist layer and wide focusing depth characteristic. The polyhydroxystyrene resin for the component (A1) should have a weight-average molecular weight in the range from 3000 to 30000 or, preferably, from 7000 to 20000.

The tetrahydropyranyl-substituted polyhydroxystyrene resin as the component (A1) can be prepared by a known method of, for example, reacting a polyhydroxystyrene resin and 2,3-dihydro-4H-pyran dissolved in an organic solvent such as tetrahydrofuran, dimethylformamide and dimethylacetamide in the presence of an acidic catalyst such as hydrogen chloride and p-toluene sulfonic acid.

The component (A2) to be combined with the above described component (A1) is a second polyhydroxystyrene resin substituted for a part of the hydroxyl hydrogen atoms by lower alkoxyalkyl groups represented by the general formula $$—CR^1R^2(—OR^3), \quad (I)$$

in which $R^1$ is a hydrogen atom or a methyl group, $R^2$ is a methyl or ethyl group and $R^3$ is an alkyl group having 1 to 4 carbon atoms.

Particular examples of the lower alkoxyalkyl group of the general formula (I) include: 1-methoxyethyl, 1-ethoxyethyl, 1-n-propoxyethyl, 1-isopropoxyethyl, 1-n-butoxyethyl, 1-isobutoxyethyl, 1-(1,1-dimethylethoxy)-1-methylethyl, 1-methoxy-1-methylethyl, 1-ethoxy-1-methylethyl, 1-n-propoxy-1-methylethyl, 1-isobutoxy-1-methylethyl, 1-methoxy-n-propyl and 1-ethoxy-n-propyl groups, of which 1-ethoxyethyl and 1-methoxy-n-propyl groups are particularly preferable in respect of the well balanced improvements in the photosensitivity and pattern resolution.

The degree of substitution by the lower alkoxyalkyl groups in the component (A2) is in the range from 20 to 60% or, preferably, from 25 to 50% of the hydroxyl hydrogen atoms in the polyhydroxystyrene resin in order to accomplish a good cross sectional profile of the patterned resist layer and wide focusing depth characteristic. The polyhydroxystyrene resin for the component (A2) should have a weight-average molecular weight in the range from 3000 to 30000 or, preferably, from 7000 to 20000.

The substituted polyhydroxystyrene resin as the component (A2) can be prepared by either of the known methods including (1) a method in which a polyhydroxystyrene resin and an alkyl vinyl ether are reacted in an organic solvent such as tetrahydrofuran, dimethylformamide and dimethylacetamide in the presence of an acidic catalyst such as hydrogen chloride and p-toluene sulfonic acid and (2) a method in which a polyhydroxystyrene resin and a halogenated alkoxyalkane compound such as 1-chloro-1-ethoxyethane and 1-chloro-1-methoxypropane are reacted in an organic solvent such as tetrahydrofuran, dimethylformamide and dimethylacetamide in the presence of a basic catalyst such as triethylamine, triethanolamine and pyridine. Of the above described two methods, the latter method (2) is preferred to the former method (1) in respect of obtaining a high and reproducible quality of the product since intermixing of a by-product is sometimes unavoidable in the former method.

In the inventive photoresist composition, the component (A) is a combination of the above described components (A1) and (A2) in a weight proportion in the range from 10:90 to 80:20 or, preferably, from 20:80 to 70:30 to build up 100 parts by weight of the component (A).

In the next place, a description is given of the component (B) which is a radiation-sensitive acid-generating agent and can be selected from those conventionally used in chemical-sensitization photoresist compositions without particular limitations. Particular examples of the acid-generating compounds include those belonging to the classes (1) to (7) shown below.

(1) Bissulfonyl diazomethane compounds such as bis(p-toluene-sulfonyl) diazomethane, bis(1,1-dimethylethylsulfonyl) diazomethane, bis(cyclohexylsulfonyl) diazomethane and bis(2,4-dimethylphenylsulfonyl) diazomethane (2) Nitrobenzyl compounds such as 2-nitrobenzyl p-toluenesulfonate and 2,6-dinitrobenzyl p-toluenesulfonate (3) Sulfonic acid ester compounds such as pyrogallol trimesylate and pyrogallol tritosylate (4) Onium salt compounds such as diphenyliodonium hexafluorophosphate, (4-methoxyphenyl)phenyliodonium trifluoromethane sulfonate, bis(p-tert-butylphenyl)iodonium trifluoromethane sulfonate, triphenylphosphonium hexafluorophosphate, (4-methoxyphenyl)diphenylsulfonium trifluoromethane sulfonate and (p-tert-butylphenyl)diphenylsulfonium trifluoromethane sulfonate (5) Benzoin tosylate compounds such as benzoin tosylate and α-methylbenzoin tosylate (6) Halogen-containing triazine compounds such as:
2-(4-methoxyphenyl)-4,6-bis(trichoromethyl)-1,3,5-triazine
2-(4-methoxynaphthyl)-4,6-bis(trichloromethyl)-1,3,5-triazine,
2-[2-(2-furyl)ethenyl]-4,6-bis(trichloromethyl)-1,3,5-triazine,
2-[2-(5-methyl-2-furyl)ethenyl]-4,6-bis(trichloromethyl)-1,3,5-triazine,
2-[2-(3,5-dimethoxyphenyl)ethenyl]-4,6-bis(trichloromethyl)-1,3,5-triazine,
2-[2-(3,4-dimethoxyphenyl)ethenyl-4,6-bis(trichloromethyl)-1,3,5-triazine,
2-(3,4-methylenedioxyphenyl)-4,6-bis(trichloromethyl)-1,3,5-triazine,
2,4,6-tris(2,3-dibromopropyl)-1,3,5-triazine and tris(2,3-dibromopropyl) isocyanurate (7) Cyano group-containing oximesulfonate compounds such as those compounds represented by the general formulas $$R^4—C(CN)=N—O—SO_2—R^5, \quad (II)$$

in which $R^4$ and $R^5$ are each a non-aromatic group, $$R^6—C(CN)=N—O—SO_2—R^7, \quad (III)$$

in which $R^6$ is an aromatic group and $R^7$ is a lower alkyl group or a halogenated lower alkyl group,

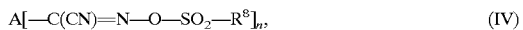

in which the subscript n is 2 or 3, A is a divalent, when n is 2, or tervalent, when n is 3, organic group and $R^8$ is a substituted or unsubstituted monovalent hydrocarbon group, and

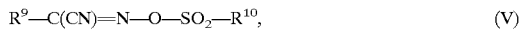

in which $R^9$ is an inactive organic group and $R^{10}$ is an aromatic polycyclic hydrocarbon group or an unsubstituted or substituted, unsaturated or saturated non-aromatic polycyclic hydrocarbon group.

The non-aromatic group denoted by $R^4$ or $R^5$ in the general formula (II) is exemplified by alkyl, halogenoalkyl, alkenyl, cycloalkyl, cycloalkenyl, alkoxy, cycloalkoxy and adamantyl groups. The alkyl group, which may be straightly linear or branched, has 1 to 12 carbon atoms and includes methyl, ethyl, n-propyl, isopropyl, n-butyl, isobutyl, sec-butyl, tert-butyl, n-pentyl, n-octyl and n-dodecyl groups. In the halogenoalkyl groups, which preferably has 1 to 4 carbon atoms, the halogen is not particularly limitative including fluorine, chlorine, bromine and iodine and the number of the halogen atoms in a halogenoalkyl group is not limited to one. Examples of the halogenoalkyl group include chloromethyl, trichloromethyl, trifluoromethyl and 2-bromopropyl groups.

The alkenyl group denoted by $R^4$ or $R^5$ in the general formula (II), which preferably has 2 to 6 carbon atoms, can be straightly linear or branched and is exemplified by vinyl, 1-propenyl, isopropenyl and 2-butenyl groups. The cycloalkyl group, which preferably has 5 to 12 carbon atoms, is exemplified by cyclopentyl, cyclohexyl, cyclooctyl and cyclododecyl groups. The cycloalkenyl group, which preferably has 4 to 8 carbon atoms, is exemplified by 1-cyclobutenyl, 1-cyclopentenyl, 1-cyclohexenyl, 1-cycloheptenyl and 1-cyclooctenyl groups. The alkoxy group, which preferably has 1 to 8 carbon atoms, is exemplified by methoxy, ethoxy, propoxy, butoxy and pentoxy groups. The cycloalkoxy group, which preferably has 5 to 8 carbon atoms, is exemplified by cyclopentoxy and cyclohexyloxy groups. In particular, the group denoted by $R^4$ is selected from alkyl, cycloalkyl and cycloalkenyl groups or, preferably, from cycloalkenyl groups and the group denoted by $R^5$ is selected from alkyl, halogenoalkyl and cycloalkyl groups or, preferably, from alkyl groups. Most preferably, the compound has a cyclopentenyl group as $R^4$ and an alkyl group of 1 to 4 carbon atoms as $R^5$.

Particular examples of the oximesulfonate compound expressed by the general formula (II) include:
α-(methylsulfonyloxyimino)-1-cyclopentenyl acetonitrile,
α-(methylsulfonyloxyimino)-1-cyclohexenyl acetonitrile,
α-(methylsulfonyloxyimino)-1-cycloheptenyl acetonitrile,
α-(methylsulfonyloxyimino)-1-cyclooctenyl acetonitrile,
α-(trifluoromethylsulfonyloxyimino)-1-cyclopentenyl acetonitrile,
α-(trifluoromethylsulfonyloxyimino)cyclohexyl acetonitrile,
α-(ethylsulfonyloxyimino)ethyl acetonitrile,
α-(propylsulfonyloxyimino)propyl acetonitrile,
α-(cyclohexylsulfonyloxyimino)cyclopentyl acetonitrile,
α-(cyclohexylsulfonyloxyimino)cyclohexyl acetonitrile,
α-(cyclohexylsulfonyloxyimino)-1-cyclopentenyl acetonitrile,
α-(ethylsulfonyloxyimino)-1-cyclopentenyl acetonitrile,
α-(isopropylsulfonyloxyimino)-1-cyclopentenyl acetonitrile,
α-(n-butylsulfonyloxyimino)-1-cyclopentenyl acetonitrile,
α-(ethylsulfonyloxyimino)-1-cyclohexenyl acetonitrile,
α-(isopropylsulfonyloxyimino)-1-cyclohexenyl acetonitrile, and
α-(n-butylsulfonyloxyimino)-1-cyclohexenyl acetonitrile.

The aromatic group denoted by $R^6$ in the above given general formula (III) is exemplified by phenyl, naphthyl, furyl and thienyl groups which can optionally be substituted by one or more of halogen atoms, alkyl groups, alkoxy groups, nitro groups and the like. The lower alkyl groups as a class of the groups denoted by $R^7$ are exemplified by the straightly linear or branched alkyl groups having 1 to 4 carbon atoms such as methyl, ethyl, n-propyl, isopropyl, n-butyl, isobutyl, sec-butyl and tert-butyl groups. The halogenoalkyl groups as the other class of the groups denoted by $R^7$ are exemplified by the halogenoalkyl groups having 1 to 4 carbon atoms such as chloromethyl, trichloromethyl, trifluoromethyl and 2-bromopropyl groups.

Particular examples of the oximesulfonate compound expressed by the general formula (III) include:
α-(methylsulfonyloxyimino)phenyl acetonitrile,
α-(methylsulfonyloxyimino)-4-methoxyphenyl acetonitrile,
α-(trifluoromethylsulfonyloxyimino)phenyl acetonitrile,
α-(trifluoromethylsulfonyloxyimino)-4-methoxyphenyl acetonitrile,
α-(ethylsulfonyloxyimino)-4-methoxyphenyl acetonitrile,
α-(propylsulfonyloxyimino)-4-methylphenyl acetonitrile and
α-(methylsulfonyloxyimino)-4-bromophenyl acetonitrile.

The hydrocarbon groups as a class of the groups denoted by $R^8$ in the general formula (IV) include aromatic and non-aromatic hydrocarbon groups. The aromatic group should preferably have 6 to 14 carbon atoms as exemplified by phenyl, tolyl, methoxyphenyl, xylyl, biphenyl, naphthyl and anthryl groups as well as heterocyclic groups such as furanyl, pyridyl and quinolyl groups. The non-aromatic hydrocarbon group, which is free from an aromatic ring structure such as benzene, naphthalene, furan, thiophene and pyridine rings, includes aliphatic hydrocarbon groups and alicyclic hydrocarbon groups such as alkyl, alkenyl, cycloalkyl and cycloalkenyl groups. The alkyl groups, which may be straightly linear or branched, preferably have 1 to 12 carbon atoms as exemplified by methyl, ethyl, propyl, isopropyl, n-butyl, sec-butyl, tert-butyl, n-pentyl, n-octyl and n-dodecyl groups. The alkenyl groups preferably have 2 to 12 carbon atoms as exemplified by ethenyl, propenyl, butenyl, butadienyl, hexenyl and octadienyl groups. The cycloalkyl groups, which preferably have 4 to 12 carbon atoms, are exemplified by cyclopentyl, cyclohexyl, cyclooctyl and cyclododecyl groups. The cycloalkenyl groups, which preferably have 4 to 12 carbon atoms, are exemplified by 1-cyclobutenyl, 1-cyclopentenyl, 1-cyclohexenyl, 1-cycloheptenyl and 1-cyclooctenyl groups.

The substituted hydrocarbon groups as the other class of the groups denoted by $R^8$ are exemplified by those obtained by the substitution of one or more substituent groups for the hydrogen atoms of the above named aromatic or non-aromatic hydrocarbon groups, of which those substituted by halogen atoms, e.g., chlorine, bromine and fluorine atoms, hydroxyl groups, alkoxy groups and acyl groups are preferable or, in particular, halogenated aryl groups and halogenated alkyl groups are more preferable. Suitable halogenated alkyl groups include those having 1 to 4 carbon atoms such as chloromethyl, trichloromethyl, trifluoromethyl and 2-bromopropyl groups.

The divalent or tervalent organic group denoted by A in the general formula (IV) is preferably a divalent or tervalent, aliphatic or aromatic hydrocarbon group.

Examples of the oximesulfonate compounds expressed by the general formula (IV), in which the group denoted by $R^8$ is a non-aromatic hydrocarbon group, include the compounds expressed by the following structural formulas, in which Me is a methyl group, Et is an ethyl group, Bu is a butyl group, fMe is a trifluoromethyl group, Ch is a cyclohexyl group, pPn is a 1,4-phenylene group and mPn is a 1,3-phenylene group:

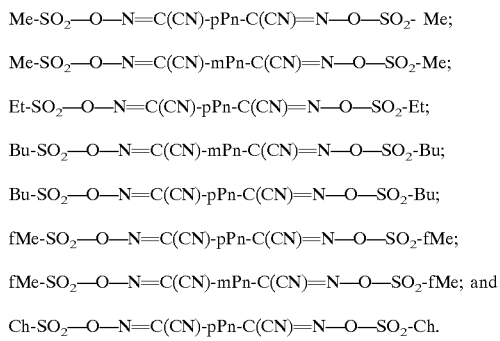

Further, examples of the oximesulfonate compounds expressed by the general formula (IV), in which the group denoted by $R^8$ is an aromatic hydrocarbon group, include the compounds expressed by the following structural formulas, in which Me is a methyl group, Ph is a phenyl group, pPn is a 1,4-phenylene group and mPn is a 1,3-phenylene group:

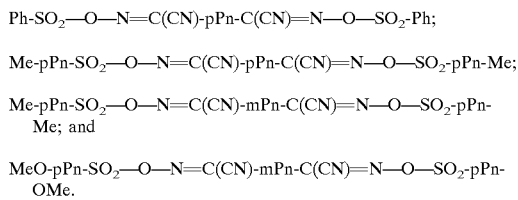

The above mentioned inert organic group denoted by $R^9$ in the general formula (V) is a group having no reactivity with the various ingredients contained in the inventive resist composition. Though not particularly limitative, the group $R^9$ is preferably an aromatic cyclic group in respect of the sensitivity of the photoresist composition to excimer laser beams, electron beams and X-rays. The aromatic cyclic group here implied is a group having physical and chemical properties inherent in aromatic compounds including, for example, phenyl, naphthyl, furyl and thienyl groups, optionally, substituted by inert substituent groups such as halogen atoms, e.g., atoms of chlorine, bromine and iodine, alkyl groups, alkoxy groups and nitro groups.

The aromatic polycyclic hydrocarbon group as a class of the group denoted by $R^{10}$ in the general formula (V) is exemplified by aromatic condensed-ring polycyclic hydrocarbon groups such as 2-indenyl, 1-naphthyl, 2-naphthyl and 2-anthryl groups and aromatic non-condensed-ring polycyclic hydrocarbon groups such as biphenyl and terphenyl groups. These hydrocarbon groups can be substituted by a substituent such as an atom of halogen, e.g., chlorine, bromine and iodine, nitro group, amino group, hydroxyl group, alkyl group and alkoxy group as in 5-hydroxy-1-naphthyl group and 4-amino-1-naphthyl group.

The unsaturated or saturated non-aromatic polycyclic hydrocarbon group as the other class of the groups denoted by $R^{10}$ in the general formula (V) is preferably a polycyclic hydrocarbon group such as a polycyclic terpene residue and adamantyl group which can be substituted on the ring by an atom of halogen, e.g., chlorine, bromine and iodine, nitro group, amino group, hydroxyl group, oxo group, alkyl group or alkoxy group. Examples of the groups suitable as $R^{10}$ include camphor-3-yl, camphor-8-yl, camphor-10-yl and 3-bromocamphor-10-yl groups. The group $R^{10}$ is preferably a naphthyl group or camphor-10-yl group or, more preferably, 1-naphthyl group in respect of the good pattern resolution.

Examples of the oximesulfonate compounds represented by the general formula (V) include:

α-(1-naphthylsulfonyloxyimino)-4-methoxybenzyl cyanide,
α-(2-naphthylsulfonyloxyimino)-4-methoxybenzyl cyanide,
α-(1-naphthylsulfonyloxyimino)benzyl cyanide,
α-(2-naphthylsulfonyloxyimino)benzyl cyanide,
α-(10-camphorsulfonyloxyimino)-4-methoxybenzyl cyanide,
α-(10-camphorsulfonyloxyimino)benzyl cyanide,
α-(3-camphorsulfonyloxyimino)-4-methoxybenzyl cyanide,
α-(10-camphorsulfonyloxyimino)-4-methoxybenzyl cyanide and the like.

Among these acid-generating compounds, preferable are bissulfonyl diazomethane compounds, onium salt compounds and cyano group-containing oximesulfonate compounds.

The above described various radiation-sensitive acid-generating compounds can be used as the component (B) in the inventive photoresist composition either singly or as a combination of two kinds or more according to need. The amount of the component (B) in the inventive photoresist composition is in the range, usually, from 0.5 to 20 parts by weight or, preferably, from 1 to 10 parts by weight per 100 parts by weight of the component (A). When the amount of the component (B) is too small, the image-forming characteristic of the composition would be low while, when the amount thereof is too large, difficulties are encountered in obtaining a uniform solution of the composition along with an eventual decrease in the storage stability of the composition.

It is optional, if desired to further improve the cross sectional profile of the patterned resist layer and the post-exposure stability of the latent images in the pattern-wise exposed photoresist layer, that the inventive photoresist composition is admixed with (C) an amine compound and/or (D) a carboxylic acid compound. Each of these optional adjuvant compounds is not particularly limitative and can be selected from those conventionally used in chemical-sensitization photoresist compositions.

The amine compounds as the component (C) include aliphatic amines such as dimethylamine, trimethylamine, ethylamine, diethylamine, triethylamine, n-propylamine, di-n-propylamine, tri-n-propylamine, tributylamine, tripentylamine and isopropylamine, aromatic amines such as benzylamine, aniline, N-methylaniline and N,N-dimethylaniline, o-, m- and p-methylanilines, N,N-diethylaniline, diphenylamine and di-p-tolylamine and heterocyclic amines such as pyridine, 2-methylpyridine, 2-ethylpyridine, 2,3-dimethylpyridine, 4-ethyl-2-methylpyridine and 3-ethyl-4-methylpyridine, of which trialkyl amines such as triethylamine, tributylamine and tripentylamine are particularly preferable because these amine compounds give a resist composition of which the cross sectional profile of the patterned resist layer is excellently orthogonal along with good stability of the latent images formed in the resist layer by pattern-wise exposure to actinic rays. These amine compounds can be used either singly or as a combination of two kinds or more.

Further, the carboxylic acid compounds as the component (D) include monobasic and polybasic saturated aliphatic carboxylic acids such as formic acid, acetic acid, propionic acid, butyric acid, isobutyric acid, oxalic acid, malonic acid, succinic acid, glutamic acid and adipic acid, unsaturated aliphatic carboxylic acids such as acrylic acid, crotonic acid, isocrotonic acid, 3-butenoic acid, methacrylic acid, 4-pentenoic acid, propiolic acid, 2-butynoic acid, maleic acid and fumaric acid, alicyclic carboxylic acids such as 1,1-cyclohexane dicarboxylic acid, 1,2-cyclohexane dicarboxylic acid, 1,3-cyclohexane dicarboxylic acid, 1,4-cyclohexane dicarboxylic acid and 1,1-cyclohexane diacetic acid, oxycarboxylic acids such as hydroxyacetic acid, alkoxy carboxylic acids such as methoxyacetic acid and ethoxyacetic acid, ketocarboxylic acid such as pyruvic acid, and aromatic carboxylic acids having a hydroxyl, nitro, carboxyl or vinyl group as the substituent such as p-hydroxybenzoic acid, salicylic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid and isophthalic acid.

Among the above named carboxylic acids, aromatic carboxylic acids and saturated aliphatic carboxylic acids are preferred in respect of the adequate strength of the acid. In particular, salicylic acid and malonic acid are more preferable because these acids have good solubility in the solvents used in resist compositions along with excellent patterning behavior of the resist composition formulated therewith. These carboxylic acid compounds can be used either singly or as a mixture of two kinds or more.

The amount of the amine compound as the component (C), when added to the inventive composition, is in the range from 0.01 to 1 part by weight or, preferably, from 0.05 to 0.5 part by weight per 100 parts by weight of the component (A) in order to accomplish prevention of useless diffusion of the acid generated from the component (B) by the pattern-wise exposure of the photoresist layer to actinic rays so as to improve the fidelity of the resist pattern to the photomask pattern along with an improvement in the pattern resolution and post-exposure stability of the latent images formed in the resist layer. When the amount of the amine compound is too small, no full improvement can be obtained in the pattern resolution and post-exposure stability while, when the amount thereof is too large, a decrease is caused in the photosensitivity of the composition.

The amount of the carboxylic acid compound as the component (D), when added to the inventive composition, is in the range from 0.01 to 10 parts by weight or, preferably, from 0.05 to 2.0 parts by weight per 100 parts by weight of the component (A) in order to accomplish prevention of the decrease in the photosensitivity due to the addition of the component (C) along with a further improvement in the pattern resolution and decrease in the substrate dependency. When the amount of the carboxylic acid compound is too small, no improvement can be obtained in the substrate dependency of the composition while, when the amount thereof is too large, an undesirable increase is caused in the film thickness reduction in the areas unexposed to light in the development treatment.

The positive-working photoresist composition of the invention is preferably used in the form of a uniform solution prepared by dissolving the above described essential and optional ingredients in an organic solvent. Examples of suitable organic solvents include: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof; cyclic ether solvents such as dioxane; and ester solvents such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more according to need.

It is of course optional according to need that the photoresist composition of the invention is admixed with various kinds of known additives formulated in conventional photoresist compositions including, for example, auxiliary resins to improve the properties of the resist film, plasticizers, stabilizers, coloring agents, surface active agents and others each in a limited amount.

The multilayered resist material provided by the present invention comprises a substrate, an antireflection undercoating layer formed on one surface of the substrate and a photoresist layer formed on the antireflection coating layer by using the above described chemical-sensitization positive-working photoresist composition of the invention. The antireflection undercoating layer serves to prevent or reduce the adverse influences of the standing waves from the highly reflective substrate surface, optionally, having a coating layer of aluminum, silicon nitride and the like. The antireflection undercoating layer can be formed from various kinds of coating materials without particular limitations including those containing an ultraviolet absorber and a crosslinking agent, those containing an ultraviolet absorber and a binder resin and those containing an ultraviolet absorber, a crosslinking agent and a binder resin. Suitable ultraviolet absorbers include benzophenone compounds, azomethine compounds, diphenyl sulfone compounds and diphenyl sulfoxide compounds.

The crosslinking agent above mentioned is a compound having, in the molecule, functional groups capable of forming crosslinks between the molecules of the compound per se or between its molecules and the molecules of the ultraviolet absorber and/or binder resin. Examples of suitable crosslinking agents include nitrogen-containing organic compounds having, in a molecule, at least two amino groups substituted by hydroxyalkyl and/or alkoxyalkyl groups such as melamine, urea, guanamine, benzoguanamine, glycoluryl, succinylamide and ethyleneurea substituted by at least two methylol and/or alkoxymethyl groups for the hydrogen atoms of the amino groups in a molecule.

The binder resin which may be contained in the antireflection undercoating layer is exemplified by polyamide acids, halogenated polymers, polyacetal resins, acetal copolymers, substituted vinyl polymers, polyamine acid resins, polybutenesulfonic acid resins and acrylic resins, of which acrylic resins are particularly preferable.

The coating composition for the formation of the antireflection undercoating layer can be prepared from the above described ultraviolet absorbers in combination with the crosslinking agents and/or binder resins but it is optional to admix the composition with known additives having compatibility with the essential ingredients including organic acids such as acetic acid, oxalic acid, maleic acid, o-hydroxybenzoic acid, 3,5-dinitrobenzoic acid and 2,6-dihydroxybenzoic acid as well as a copolymeric acid of o-hydroxybenzoic acid and p-xylene sold under the trade name of SAX (a product by Mitsui Toatsu Chemical Co.).

Further, the coating composition in the form of a solution is optionally admixed with a surface active agent with a purpose of improvement in the coating workability and striation inhibition, if desired.

The antireflection undercoating layer on the substrate surface is formed by coating the surface of a substrate such as a semiconductor silicon wafer with the above mentioned coating solution by using a conventional coating machine such as spinners to form a coating layer followed by drying and a baking treatment at a temperature of 100° to 300° C. to effect thermal crosslinking in the coating layer by means of the crosslinking agent. The thus formed antireflection undercoating layer has a thickness in the range, usually, from 0.05 to 0.5 μm or, preferable, from 0.1 to 0.3 μm.

The multilayered photoresist material of the invention is prepared by forming a photoresist layer on the antireflection undercoating layer using the above described chemical-sensitization positive-working photoresist composition by using a suitable coating machine such as spinners followed by drying. The thus formed photoresist layer has a thickness in the range, usually, from 0.5 to 3.0 μm or, preferable, from 0.7 to 1.5 μm.

The procedure for the formation of a patterned resist layer by using the inventive multilayered photoresist material is rather conventional. Namely, the photoresist layer is pattern-wise exposed to actinic rays such as deep ultraviolet light, excimer laser beams and X-rays through a pattern-bearing photomask on a minifying projection exposure machine or by pattern-wise scanning with electron beams to form a patterned latent image in the resist layer followed by a post-exposure baking treatment and then a development treatment by using an aqueous alkaline developer solution such as a 1 to 10% by weight aqueous solution of tetramethylammonium hydroxide to give a patterned resist layer having high fidelity to the photomask pattern.

The chemical-sensitization positive-working photoresist composition and the multilayered photoresist material by using the same are advantageous in respect of the high photosensitivity, focusing depth characteristic and post-exposure stability of the latent images as well as in respect of the high contrast of the patterned images, resolution around and configuration of contact holes and heat resistance of the resist layer without being affected by the nature of the substrate surface so that the high-grade requirements in the modern photolithographic fine patterning works can well be satisfied therewith.

In the following, the chemical-sensitization positive-working photoresist composition of the invention is illustrated in more detail by way of Examples and Comparative Examples, in which the photoresist compositions were evaluated for the following items by the respective testing procedures described there.

(1) Photosensitivity (A)

A silicon wafer was coated with the photoresist composition under testing by using a spinner to form a coating layer which was dried by heating on a hot plate at 90° C. for 90 seconds to give a dried photoresist layer having a thickness of 0.7 μm. The photoresist layer was pattern-wise exposed to KrF excimer laser beams of 248 nm wavelength on a minifying projection exposure machine (Model NSR-2005EX8A, manufactured by Nikon Co.) in stepwise increased exposure doses with 1 mJ/cm$^2$ increments followed by a post-exposure baking treatment at 110° C. for 90 seconds and a development treatment using a 2.38% by weight aqueous solution of tetramethylammonium hydroxide for 60 seconds at 23° C. and then by rinse in a running water stream for 30 seconds and drying. The minimum exposure dose in mJ/cm$^2$ was recorded, as a measure of the photosensitivity of the composition, by which the resist layer in the exposed areas could be completely dissolved away in the development treatment.

(2) Cross sectional profile of patterned resist layer (A)

A resist layer in a line-and-space pattern of 0.25 μm line width was obtained in the same manner as in (1) described above and the cross sectional profile thereof was examined on a scanning electron microscopic photograph. The results were recorded in four ratings of: A for complete orthogonality of the cross sectional profile; B for a slightly trapezoidal cross sectional profile; C for a cross sectional profile with noticeable trailing skirts; and D for no pattern resolution.

(3) Focusing depth characteristic (A)

Patterning of a resist layer in a line-and-space pattern of 0.25 μm line width was conducted in the same manner as in (1) described above with varied displacements of the focusing point and the maximum range of the focusing point displacement within which an orthogonal cross sectional profile of the patterned resist layer could be obtained was recorded as the focusing depth characteristic.

(4) Substrate dependency of cross sectional profile of patterned resist layer (A)

The same patterning procedure of a resist layer in a line-and-space pattern of 0.25 μm line width was undertaken as in (1) above excepting for the replacement of the substrate silicon wafer with another wafer provided with a surface layer of silicon nitride, referred to as the substrate (a), or a wafer provided with a surface layer of titanium nitride, referred to as the substrate (b). The cross sectional profile of the thus obtained patterned resist layers was examined on a scanning electron microscopic photograph. The results were recorded in five ratings of: A for complete orthogonality of the cross sectional profile; B for almost complete orthogonality though with slight trailing of skirts; C for a trapezoidal cross sectional profile; D for a cross sectional profile with noticeable trailing of skirts; and E for unsuccessful pattern resolution. The results for the substrates (a) and (b) were identical.

(5) Stability of latent images before post-exposure baking treatment (A)

A resist layer patterned in a line-and-space pattern of 0.25 μm line width was prepared in the same manner as in (1) above excepting for standing of the pattern-wise exposed photoresist layer for 60 minutes at room temperature before the post-exposure baking treatment at 110° C. for 90 seconds followed by the development treatment. The cross sectional profile of the thus obtained line-and-space patterned resist layer was examined on a scanning electron microscopic photograph to record the results in three ratings of: A when the ratio of the line width to the space width was about the same as in the photomask pattern; B when the line width was somewhat smaller than that in the photomask pattern; and C when pattern resolution could not be obtained.

(6) Photosensitivity (B)

The procedure of testing and recording was the same as in the photosensitivity test (A) described above except that the photoresist layer was formed not directly on the surface of the silicon wafer but on an antireflection coating film having a thickness of 0.12 μm obtained by coating the silicon wafer with a commercially available coating solution containing a polymeric ultraviolet absorbing agent and a crosslinking agent (DUV-18, a product by Brewer Science Co.).

(7) Cross sectional profile of patterned resist layer (B)

The experimental procedure was just the same as in (2) described above except that examination of the cross sectional profile of the 0.25 μm width line-and-space patterned resist layer was undertaken for the resist patterns obtained in (6) described above.

(8) Focusing depth characteristic (B)

The experimental procedure was just the same as in (3) described above except that evaluation of the focusing depth characteristic was undertaken for the resist patterns obtained in (6) described above.

(9) Substrate dependency of cross sectional profile of patterned resist layer (B)

The experimental procedure was just the same as in (4) described above except that the antireflection undercoating film was provided on the wafer (a) or (b) having a coating layer of silicon nitride or titanium nitride, respectively. The results for the wafers (a) and (b) were identical.

(10) Stability of latent images before post-exposure baking treatment (B)

The experimental procedure was just the same as in (5) described above except that the photoresist layer was formed on the antireflection coating film formed in the same manner as in (6).

EXAMPLE 1

A positive-working chemical-sensitization photoresist composition was prepared in the following manner. Thus, 30 parts by weight of a first polyhydroxystyrene resin having a weight-average molecular weight of 10000, which was substituted by tetrahydropyranyl groups for 40% of the hydroxyl groups, 70 parts by weight of a second polyhydroxystyrene resin having a weight-average molecular weight of 10000, which was substituted by ethoxyethyl groups for 40% of the hydroxyl groups, 5 parts by weight of bis(cyclohexylsulfonyl) diazomethane, 1 part by weight of bis(p-tert-butylphenyl)-iodonium trifluoromethane sulfonate and 1 part by weight of α-(naphthylsulfonyloxyimino)-4-methoxyphenyl acetonitrile were dissolved in 400 parts by weight of propyleneglycol monomethyl ether acetate and the solution was filtered through a membrane filter of 0.2 μm pore diameter to give a uniform photoresist solution, which was subjected to the evaluation tests in the above described procedures to give the results shown in Table 1 below.

EXAMPLES 2 to 4

The experimental procedure in each of Examples 2, 3 and 4 was just the same as in Example 1 described above excepting for an additional admixture of the solution with 0.1 part by weight of triethylamine, 0.3 part by weight of salicylic acid or a combination of 0.1 part by weight of triethylamine and 0.3 part by weight of salicylic acid, respectively.

The results of the evaluation tests are shown in Table 1.

COMPARATIVE EXAMPLE 1

The experimental procedure was just the same as in Example 4 described above excepting for the replacement of the tetrahydropyranyl-substituted polyhydroxystyrene resin with the same amount of a third substituted polyhydroxystyrene resin having a weight-average molecular weight of 10000, which was substituted by tert-butoxycarbonyl groups for 40% of the hydroxyl groups.

The results of the evaluation tests are shown in Table 1.

COMPARATIVE EXAMPLE 2

The experimental procedure was just the same as in Example 4 described above excepting for the replacement of a combination of the first and second substituted polyhydroxystyrene resins with 100 parts by weight of the same first substituted polyhydroxystyrene resin alone.

The results of the evaluation tests are shown in Table 1.

TABLE 1

| Item No. | | Photo-sensitivity, mJ/cm$^2$ | | Cross sectional profile | | Focusing depth, μm | | Substrate dependency | | Post exposure stability | |
|---|---|---|---|---|---|---|---|---|---|---|---|
| | | (1) | (6) | (2) | (7) | (3) | (8) | (4) | (9) | (5) | (10) |
| Example | 1 | 5 | 6 | B | A | 0.6 | 0.8 | D | A | B | B |
| | 2 | 7 | 8 | B | A | 0.6 | 0.8 | D | A | B | B |
| | 3 | 7 | 8 | B | A | 0.6 | 0.8 | B | A | A | A |
| | 4 | 10 | 12 | A | A | 1.5 | 1.5 | A | A | A | A |
| Comparative Example | 1 | 10 | 12 | C | B | 1.0 | 1.0 | B | C | A | A |
| | 2 | 45 | 55 | D | D | *) | *) | E | E | C | C |

*) no pattern resolution

What is claimed is:

1. A chemical-sensitization positive-working photoresist composition which comprises, as a uniform solution in an organic solvent:
   (A) 100 parts by weight of a film-forming resin which causes an increase in the solubility in an aqueous alkaline solution by interacting with an acid, which is a combination of
      (A1) a first polyhydroxystyrene resin substituted by tetrahydropyranyl groups for a part of the hydroxyl hydrogen atoms, and
      (A2) a second polyhydroxystyrene resin substituted by alkoxyalkyl groups for a part of the hydroxyl hydrogen atoms, in a weight proportion of (A1):(A2) in the range from 10:90 to 80:20; and
   (B) from 0.5 to 20 parts by weight of a radiation-sensitive acid-generating compound capable of generating an acid by exposure to actinic rays.

2. The chemical-sensitization positive-working photoresist composition as claimed in claim 1 in which the first polyhydroxystyrene resin as the component (A1) is substituted by the tetrahydropyranyl groups for 10 to 60% of the hydroxyl hydrogen atoms.

3. The chemical-sensitization positive-working photoresist composition as claimed in claim 1 in which the second polyhydroxystyrene resin as the component (A2) is substituted by the alkoxyalkyl groups for 20 to 60% of the hydroxyl hydrogen atoms.

4. The chemical-sensitization positive-working photoresist composition as claimed in claim 1 in which the weight proportion of (A1):(A2) is in the range from 20:80 to 70:30.

5. The chemical-sensitization positive-working photoresist composition as claimed in claim 1 in which the alkoxyalkyl group substituting the second polyhydroxystyrene resin is 1-ethoxyethyl group or 1-methoxy-n-propyl group.

6. The chemical-sensitization positive-working photoresist composition as claimed in claim 1 in which the first polyhydroxystyrene resin as the component (A1) has a weight-average molecular weight in the range from 3000 to 30000.

7. The chemical-sensitization positive-working photoresist composition as claimed in claim 1 in which the second polyhydroxystyrene resin as the component (A2) has a weight-average molecular weight in the range from 3000 to 30000.

8. The chemical-sensitization positive-working photoresist composition as claimed in claim 1 in which the radiation-sensitive acid-generating compound as the component (B) is selected from the group consisting of bissulfonyldiazomethane compounds, onium salt compounds and cyano group-containing oximesulfonate compounds.

9. The chemical-sensitization positive-working photoresist composition as claimed in claim 1 in which the radiation-sensitive acid-generating compound as the component (B) is a cyano group-containing oximesulfonate compound selected from the group consisting of the compounds represented by the general formula

$$R^4-C(CN)=N-O-SO_2-R^5,$$

in which $R^4$ and $R^5$ are each a non-aromatic group, the compounds represented by the general formula

$$R^6-C(CN)=N-O-SO_2-R^7,$$

in which $R^6$ is an aromatic group and $R^7$ is an alkyl group or a halogenated alkyl group, the compounds represented by the general formula

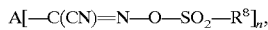
$$A[-C(CN)=N-O-SO_2-R^8]_n,$$

in which the subscript n is 2 or 3, A is a divalent, when n is 2, or tervalent, when n is 3, organic group and $R^8$ is a substituted or unsubstituted monovalent hydrocarbon group, and the compounds represented by the general formula

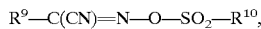
$$R^9-C(CN)=N-O-SO_2-R^{10},$$

in which $R^9$ is an inactive organic group and $R^{10}$ is an aromatic polycyclic hydrocarbon group or an unsubstituted or substituted, unsaturated or saturated non-aromatic polycyclic hydrocarbon group.

10. A chemical-sensitization positive-working photoresist composition which comprises, as a uniform solution in an organic solvent:

(A) 100 parts by weight of a film-forming resin which causes an increase in the solubility in an aqueous alkaline solution by interacting with an acid, which is a combination of
(A1) a first polyhydroxystyrene resin substituted by tetrahydropyranyl groups for a part of the hydroxyl hydrogen atoms, and
(A2) a second polyhydroxystyrene resin substituted by alkoxyalkyl groups for a part of the hydroxyl hydrogen atoms in a weight proportion of (A1):(A2) in the range from 10:90 to 80:20;
(B) from 0.5 to 20 parts by weight of a radiation-sensitive acid-generating compound capable of generating an acid by exposure to actinic rays; and
(C) an amine compound, (D) a carboxylic acid or a combination of (C) an amine compound and (D) a carboxylic acid compound, the amount of the amine compound being in the range from 0.01 to 1 part by weight and the amount of the carboxylic acid compound being in the range from 0.01 to 10 parts by weight.

11. The chemical-sensitization positive-working photoresist composition as claimed in claim 10 in which the radiation-sensitive acid-generating compound as the component (B) is selected from the group consisting of bissulfonyldiazomethane compounds, onium salt compounds and cyano group-containing oximesulfonate compounds.

12. The chemical-sensitization positive-working photoresist composition as claimed in claim 10 in which the radiation-sensitive acid-generating compound as the component (B) is a cyano group-containing oximesulfonate compound selected from the group consisting of the compounds represented by the general formula

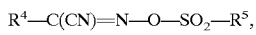
$$R^4-C(CN)=N-O-SO_2-R^5,$$

in which $R^4$ and $R^5$ are each a non-aromatic group, the compounds represented by the general formula

$$R^6-C(CN)=N-O-SO_2-R^7,$$

in which $R^6$ is an aromatic group and $R^7$ is an alkyl group or a halogenated alkyl group, the compounds represented by the general formula

$$A[-C(CN)=N-O-SO_2-R^8]_n,$$

in which the subscript n is 2 or 3, A is a divalent, when n is 2, or tervalent, when n is 3, organic group and $R^8$ is a substituted or unsubstituted monovalent hydrocarbon group, and the compounds represented by the general formula

$$R^9-C(CN)=N-O-SO_2-R^{10},$$

in which $R^9$ is an inactive organic group and $R^{10}$ is an aromatic polycyclic hydrocarbon group or an unsubstituted or substituted, unsaturated or saturated non-aromatic polycyclic hydrocarbon group.

13. The chemical-sensitization positive-working photoresist composition as claimed in claim 10 in which the amine compound as the component (C) is a trialkyl amine compound.

14. The chemical-sensitization positive-working photoresist composition as claimed in claim 10 in which the carboxylic acid compound as the component (D) is selected from the group consisting of aromatic carboxylic acid compounds and saturated aliphatic carboxylic acid compounds.

15. A multilayered photoresist material for photolithographic patterning of a resist layer which comprises, as an integral body:

(a) a substrate;
(b) an antireflection undercoating layer formed on one surface of the substrate; and
(c) a photoresist layer formed on the antireflection undercoating layer which is a layer of a chemical-sensitization positive-working photoresist composition comprising, as a uniform blend:
(A) 100 parts by weight of a film-forming resin which causes an increase in the solubility in an aqueous alkaline solution by interacting with an acid, which is a combination of
(A1) a first polyhydroxystyrene resin substituted by tetrahydropyranyl groups for a part of the hydroxyl hydrogen atoms, and
(A2) a second polyhydroxystyrene resin substituted by alkoxyalkyl groups for a part of the hydroxyl hydrogen atoms, in a weight proportion of (A1):(A2) in the range from 10:90 to 80:20; and
(B) from 0.5 to 20 parts by weight of a radiation-sensitive acid-generating compound capable of generating an acid by exposure to actinic rays.

16. The multilayered photoresist material for photolithographic patterning of a resist layer as claimed in claim 15 in which the antireflection undercoating layer has a thickness in the range from 0.05 to 0.5 $\mu$m.

17. The multilayered photoresist material for photolithographic patterning of a resist layer as claimed in claim 15 in which the radiation-sensitive acid-generating compound as the component (B) is selected from the group consisting of bissulfonyldiazomethane compounds, onium salt compounds and cyano group-containing oximesulfonate compounds.

18. The multilayered photoresist material for photolithographic patterning of a resist layer as claimed in claim 15 in which the radiation-sensitive acid-generating compound as the component (B) is a cyano group-containing oximesulfonate compound selected from the group consisting of the compounds represented by the general formula $$R^4-C(CN)=N-O-SO_2-R^5,$$

in which $R^4$ and $R^5$ are each a non-aromatic group, the compounds represented by the general formula $$R^6-C(CN)=N-O-SO_2-R^7,$$

in which $R^6$ is an aromatic group and $R^7$ is an alkyl group or a halogenated alkyl group, the compounds represented by the general formula $$A[-C(CN)=N-O-SO_2-R^8]_n,$$

in which the subscript n is 2 or 3, A is a divalent, when n is 2, or tervalent, when n is 3, organic group and $R^8$ is a substituted or unsubstituted monovalent hydrocarbon group, and the compounds represented by the general formula $$R^9-C(CN)=N-O-SO_2-R^{10},$$

in which $R^9$ is an inactive organic group and $R^{10}$ is an aromatic polycyclic hydrocarbon group or an unsubstituted or substituted, unsaturated or saturated non-aromatic polycyclic hydrocarbon group.

19. The multilayered photoresist material for photolithographic patterning of a resist layer as claimed in claim 15 in which the photoresist layer has a thickness in the range from 0.5 to 3.0 μm.

20. The multilayered photoresist material for photolithographic patterning of a resist layer as claimed in claim 15 in which the antireflection undercoating layer is formed from a composition comprising an ultraviolet absorbing agent selected from the group consisting of benzophenone compounds, azomethine compounds, diphenyl sulfone compounds and diphenyl sulfoxide compounds and a crosslinking agent which is a nitrogen-containing organic compound having at least one amino group substituted by at least two hydroxyl groups, alkoxyalkyl groups or a combination thereof.

21. The multilayered photoresist material for photolithographic patterning of a resist layer as claimed in claim 20 in which the nitrogen-containing organic compound having at least one amino group substituted by at least two hydroxyl groups, alkoxyalkyl groups or a combination thereof is a melamine compound or a benzoguanamine compound substituted by at least two hydroxyl groups, alkoxyalkyl groups or a combination thereof.

* * * * *